(12) United States Patent
Tiwary et al.

(10) Patent No.: US 8,195,427 B2
(45) Date of Patent: Jun. 5, 2012

(54) METHODS AND SYSTEMS FOR HIGH SIGMA YIELD ESTIMATION USING REDUCED DIMENSIONALITY

(75) Inventors: Saurabh Tiwary, Berkeley, CA (US);
Hongzhou Liu, Sewickley, PA (US);
Hui Zhang, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 200 days.

(21) Appl. No.: 12/646,644

(22) Filed: Dec. 23, 2009

(65) Prior Publication Data

US 2011/0153272 A1 Jun. 23, 2011

(51) Int. Cl.
*G06F 17/18* (2006.01)
(52) U.S. Cl. ...................................... 702/181
(58) Field of Classification Search ................... 702/181
See application file for complete search history.

(56) References Cited

U.S. PATENT DOCUMENTS

| | | |
|---|---|---|
| 2006/0128039 A1 | 6/2006 | Lin et al. |
| 2006/0248031 A1 | 11/2006 | Kates et al. |
| 2006/0259271 A1 | 11/2006 | House et al. |
| 2006/0273266 A1 | 12/2006 | Preil et al. |
| 2007/0271292 A1 | 11/2007 | Acharya et al. |
| 2008/0281541 A1 | 11/2008 | Singh et al. |
| 2009/0132864 A1 | 5/2009 | Garbow |
| 2009/0248387 A1 | 10/2009 | Singhee et al. |

OTHER PUBLICATIONS

Antreich, Kurt, et al., "Circuit Analysis and Optimization Drive by Worst-Case Distances," IEEE Transaction on Computer-Aided Design of Integrated Circuits and Systems, Jan. 1994, pp. 57-71, vol. 13 No. 1.

Dolecek, Lara, et al., "Breaking the Simulation Barrier: SRAM Evaluation Through Norm Minimization," In Proceeding of the 2008 IEEE/ACM International Conference on Computer-Aided Design, 2008, pp. 322-329, IEEE Press, Piscataway, NJ.

International Search Report and Written Opinion of PCT/US10/57609 mailed on Feb. 8, 2011, 9 pages.

International Search Report and Written Opinion of PCT/US10/59290 mailed on Feb. 8, 2011, 11 pages.

Kanj, Rouwaida, et al., "Mixture Importance Sampling and Its Application to the Analysis of SRAM Designs in the Presence of Rare Failure Events," In Proceedings of the 43$^{rd}$ Annual Design Automation Conference, 2006, pp. 69-72, ACM, New York, NY.

Oh, Man-Suk, et al., "Integration of Multimodal Functions by Monte Carlo Importance Sampling," Department of Statistics Purdue University Technical Report #91-31C, Jun. 1991, pp. 30.

*Primary Examiner* — Drew A Dunn
*Assistant Examiner* — Stephen Cherry
(74) *Attorney, Agent, or Firm* — Kilpatrick Townsend & Stockton LLP

(57) ABSTRACT

For an integrated circuit associated with a first plurality of parameters whose values are described by a first probability distribution function, a method for estimating a failure probability includes selecting a first plurality of samples, performing a first test to determine an outcome for each of the first plurality of samples and identifying failed samples. A second plurality of parameters is selected that has fewer parameters than the first plurality of parameters. The failed samples are clustered in the space of the second plurality of parameters using a computer-implemented cluster forming method that, in some cases, returns multiple clusters. The method also includes forming a probability distribution function for each of the clusters, forming a composite probability distribution function that includes a weighted combination of the first probability distribution function and the probability distribution function for each of the clusters. The method further includes selecting a second plurality of samples using the composite probability distribution function and performing a second test to determine an outcome for each of the second plurality of samples. A failure probability can then be computed.

28 Claims, 20 Drawing Sheets

$$F_1 = s_1 + 0.4s_2 < 5$$

$$F_2 = s_1 + 0.4s_2 + 0.04s_3 + 0.004s_4 + 0.0004s_5 + 0.00004s_6 < 5$$

$$F_3 = s_1 + s_2 + 0.01 \cdot (s_1 + s_2)^3 < 8$$

$$F_4 = s_1 + s_2 + 10 \cdot \frac{e^{0.5s_1 + 0.5s_2} - 1}{e^{0.5s_1 + 0.5s_2} + 1} < 15$$

$$F_5 = \sqrt{(s_1 - 6)^2 + (s_2 - 8)^2} > 6$$

$$F_6 = \sqrt{(s_1 + 6)^2 + (s_2 + 8)^2} < 14$$

$$F_7 = \sqrt{(s_1 - 1)^2 + (s_2 - 2)^2 + (s_3 - 3)^2 + (s_4 - 4)^2 + (s_5 - 5)^2} > 4$$

$$F_8 = \sqrt{(s_1 + 1)^2 + (s_2 + 2)^2 + (s_3 + 3)^2 + (s_4 + 4)^2 + (s_5 + 5)^2} < 11.8$$

$$F_9 = 0.1s_1 + 0.2s_2 + 0.7s_3 + 0.7s_4 + 0.7s_5 + 0.7s_6 + 0.01 \cdot (0.1s_1 + 0.2s_2 + 0.7s_3 + 0.7s_4 + 0.7s_5 + 0.7s_6)^3 < 7.5$$

$$F_{10} = 0.1s_1 + 0.2s_2 + 0.7s_3 + 0.7s_4 + 0.7s_5 + 0.7s_6 + 10 \cdot \frac{e^{0.5(0.1s_1 + 0.2s_2 + 0.7s_3 + 0.7s_4 + 0.7s_5 + 0.7s_6)} - 1}{e^{0.5(0.1s_1 + 0.2s_2 + 0.7s_3 + 0.7s_4 + 0.7s_5 + 0.7s_6)} + 1} < 15$$

$$F_{11} = 0.1s_1 + 0.2s_2 + 0.7s_3 + 0.7s_4 + 0.7s_5 + 0.7s_6 + 0.5 \cdot (0.1s_1 + 0.2s_2 + 0.7s_3 + 0.7s_4 + 0.7s_5 + 0.7s_6)^3 < 80$$

$$F_{12} = 0.1s_1 + 0.2s_2 + 0.7s_3 + 0.7s_4 + 0.7s_5 + 0.7s_6 + 50 \cdot \frac{e^{0.5(0.1s_1 + 0.2s_2 + 0.7s_3 + 0.7s_4 + 0.7s_5 + 0.7s_6)} - 1}{e^{0.5(0.1s_1 + 0.2s_2 + 0.7s_3 + 0.7s_4 + 0.7s_5 + 0.7s_6)} + 1} < 50$$

$$F_{14} = \sin(s_1 * s_2) * e^{\frac{s_1 * s_2}{2}} < 0.9$$

$$F_{15} = \frac{s_1 * s_2}{1 - \frac{s_1 * s_2}{10}} < 50$$

$$F_{16} = \frac{s_1 * s_2 * s_3 * s_4 * s_5}{1 - \frac{s_1 * s_2}{10}} < 80$$

$$F17 = s_1^2 * s_2 - 10 * \left(\frac{s_1}{5}\right)^2 * s_2 < 10$$

$$F18 = s_1^2 * s_2 - 10 * \left(\frac{s_1}{5}\right)^2 * s_2 + s_3 + s_4 + s_5 + s_6 < 25$$

$$F19 = s_1 < 4$$

$$F20 = 4000 * s_1 + 7s_1^2 + s_1 * s_2^5 < 17000$$

$$F21 = 800 * s_1 + 7s_1^2 + s_1 * s_2^3 + 1500 * \cos(0.1 * s_1 * s_2) < 5000$$

$$F22 = 800 * s_1 + s_1^2 * s_2^3 + 700 * \sin(0.5 * s_1 * s_2) < 3000$$

FIG. 10

| fnld | Monte Carlo (95% confidence interval) | WCD | MixIS | Embodiments (95% confidence interval) |
|---|---|---|---|---|
| 1 | 4.56 (4.46-4.71) | 4.64 | 4.71 | 4.67 (4.61-4.76) |
| 2 | 4.56 (4.46-4.71) | 4.64 | 4.58 | 4.67 (4.51-6.00) |
| 3 | 4.18 (4.13-4.23) | 4.19 | 4.05 | 4.26 (4.20-4.33) |
| 4 | 4.2 (4.15-4.26) | 4.22 | 4.05 | 4.25 (4.20-4.32) |
| 5 | 4.06 (4.01-4.10) | 4 | 3.87 | 4.08 (4.02-4.17) |
| 6 | 3.95 (3.92-3.99) | 4 | 3.76 | 3.98 (3.93-4.04) |
| 7 | 3.78 (3.76-3.81) | 3.42 | 3.28 | 3.92 (3.83-4.07) |
| 8 | 4.15 (4.10-4.20) | 4.38 | 4 | 4.12 (4.03-4.25) |
| 9 | 4.02 (3.98-4.06) | 4 | 3.75 | 4.08 (3.96-4.32) |
| 10 | 4.17 (4.13-4.23) | 4.21 | 3.93 | 4.19 (4.07-4.44) |
| 11 | 3.74 (3.72-3.76) | 3.74 | 3.46 | 3.55 (3.44-3.74) |
| 12 | 3.99 (3.95-4.02) | 3.98 | 3.69 | 3.93 (3.79-4.25) |
| 13 | 3.54 (3.53-3.56) | 3.54 | 3.3 | 3.49 (3.42-3.58) |

FIG. 11

| fnId | Monte Carlo (95% confidence interval) | WCD | MixIS | Embodiments (95% confidence interval) |
|---|---|---|---|---|
| 14 | 3.98 (3.95-4.02) | 2.00E-12 | 4.27 | 4.12 (3.98-4.52) |
| 15 | 4.05 (4.01-4.10) | 2.00E-12 | Inf | 4.02 (3.96-4.10) |
| 16 | 4.32 (4.26-4.40) | 1.00E-12 | Inf | 4.35 (4.15-6.00) |
| 17 | 3.43 (3.41-3.44) | Inf | 3.41 | 3.47 (3.40-3.55) |
| 18 | 4.68 (4.57-4.95) | Inf | 4.48 | 4.73 (4.66-4.86) |
| 19 | 4.00 (3.96-4.04) | 4.00 | 4.00 | 3.95 (3.89-4.03) |
| 20 | 4.18 (4.13-4.24) | 4.22 | 3.86 | 4.19 (4.13-4.27) |
| 21 | 4.33 (4.27-4.42) | 4.22 | 4.38 | 4.35 (4.30-4.41) |
| 22 | 3.29 (3.28-3.30) | Inf | 3.17 | 3.25 (3.15-3.40) |

FIG. 12

| Goal ID | MC | WCD | Embodiments | Embodiments StdDev |
|---|---|---|---|---|
| Goal 1 | 0.99 | 0.9962 | 0.996482 | 0.001937 |
| Goal 2 | 0.89 | 0.6356 | 0.900637 | 0.04498 |
| Goal 3 | 0.95 | 0.9070 | 0.93865 | 0.04110 |
| Goal 4 | 0.79 | 0.8095 | 0.768923 | 0.06988 |
| Goal 5 | 1.00 | 0.9999 | 0.999995 | 3.479e-06 |
| Goal 6 | 0.93 | 0.9062 | 0.891421 | 0.0470 |
| Goal 7 | 1.00 | 0.9996 | 0.999655 | 0.000197 |
| Goal 8 | 0.95 | 0.9452 | 0.925505 | 0.03857 |

FIG. 13

| Circuit | Goal ID | MC Yield | NumMC | Embodiments |
|---|---|---|---|---|
| CKT 1 | Goal 1 | 2.6563 | 100K | 2.6951 (2.4414-6.00) |
| CKT 2 | Goal 2 | 2.6992 | 40K | 2.5207 (2.3042-3.0609) |
| CKT 2 | Goal 3 | 3.3528 | 10K | 3.6643 (3.5099-4.0658) |
| CKT 3 | Goal 4 | 2.0748 | 10K | 2.2405 (2.0385-2.6275) |

FIG. 14

| fnId | Fn Type | Num Dim | MC Yield | Imp Dim | Num Cluster | Yield | YieldMin | YieldMax |
|---|---|---|---|---|---|---|---|---|
| 1 | lin | 50 | 3.1427 | 9 | 1 | 3.1837 | 3.12406 | 3.2574 |
| 2 | lin | 100 | 2.87596 | 19 | 1 | 2.88182 | 2.8209 | 2.95579 |
| 3 | lin | 500 | 3.09502 | 50 | 1 | 3.0773 | 3.01714 | 3.15121 |
| 4 | lin+quad | 50 | 3.95668 | 6 | 1 | 3.87296 | 3.70377 | 4.69826 |
| 5 | lin+quad | 100 | 3.81533 | 8 | 2 | 3.86583 | 3.59374 | 6 |
| 6 | lin+quad | 500 | 4.52639 | 5 | 3 | 4.84327 | 4.37494 | 6 |
| 7 | sine | 50 | 3.17199 | 10 | 1 | 3.16519 | 3.10642 | 3.23747 |
| 8 | sine | 100 | 2.41107 | 19 | 1 | 2.42309 | 2.35689 | 2.502 |
| 9 | sine | 500 | 4.52639 | 54 | 2 | 4.7117 | 4.65748 | 4.78474 |
| 10 | sine+lin | 50 | 2.86319 | 10 | 1 | 2.8304 | 2.76981 | 2.90358 |
| 11 | sine+lin | 100 | 3.25598 | 19 | 1 | 3.26061 | 3.20325 | 3.33124 |
| 12 | sine+lin | 500 | 3.52343 | 51 | 1 | 3.55232 | 3.49631 | 3.62235 |

FIG. 21

| Circuit | Num Var | Imp Var | MCYield | Yield | cisYieldVar |
|---|---|---|---|---|---|
| Circuit #1 | 81 | 17 | 0.994 | 0.99 | 0.00995 |
| Circuit #1 | 81 | 16 | 0.604 | 0.6 | 0.04901 |
| Circuit #1 | 81 | 10 | 0.909 | 0.91 | 0.02863 |
| Circuit #1 | 81 | 8 | 0.935 | 0.95 | 0.0218 |
| Circuit #2 | 140 | 10 | 0.988 | 0.9873 | 0.00439 |
| Circuit #2 | 140 | 13 | 0.998 | 0.9995 | 0.00086 |
| Circuit #2 | 140 | 14 | 0.999 | 0.9978 | 0.00035 |
| Circuit #2 | 140 | 14 | 0.99 | 0.9841 | 0.00313 |
| Circuit #3 | 128 | 17 | 0.959 | 0.98 | 0.014 |
| Circuit #3 | 128 | 17 | 0.915 | 0.92 | 0.0271 |

FIG. 22

METHODS AND SYSTEMS FOR HIGH SIGMA YIELD ESTIMATION USING REDUCED DIMENSIONALITY

CROSS-REFERENCES TO RELATED APPLICATIONS

This application is related to concurrently filed U.S. application Ser. No. 12/646,623 by Tiwary, et. al, commonly owned, incorporated by reference herein in its entirety for all purposes.

BACKGROUND OF THE INVENTION

The present invention relates generally to methods and systems for estimating the likelihood of statistical events. More particularly, embodiments of the invention provide methods and systems for estimating the failure rate of high-yielding integrated circuits. The invention is also applicable to sampling and estimation in a wide range of applications.

In integrated circuit applications, it is often desirable to achieve a very high yield. Therefore, there is a need for an effective method for yield estimation in the range of high yield. However, a high yield circuit has a low failure rate, and an accurate estimation of a high yield often require collecting samples of failure events that are relatively rare. As a result, conventional methods, such as Monte Carlo simulation, require a large number of samples and can be expensive. Other conventional methods also suffer from the limitations of computational cost and low accuracy of yield estimation.

Therefore, there is a need for improved methods and systems for analyzing and estimating high yield of integrated circuits and other statistical events.

BRIEF SUMMARY OF THE INVENTION

Embodiments of the invention provide methods and systems for analysis and estimation of integrated circuit yield and other statistical events. In some embodiments, a screening test of the integrated circuit is carried out to identify failing clusters in the parameter space, which, in some cases, are disjoint. A second sampling is taken to provide more information in the failing regions, and a second test is carried out for determining the failure rate. In some embodiments, the number of parameters are reduced to facilitate cluster formation. Various methods of forming clusters and local probability distribution functions are also described. The methods and systems are also extended to analysis and estimation of other events that can be subject to statistical analysis. Embodiments of the present invention provide more accurate results at less computational cost than conventional techniques, especially for events of low probability. Such events include, for example, failure rates of high-yielding integrated circuits.

An embodiment of the present invention provides a method for estimating a failure probability of an integrated circuit associated with a plurality of parameters, whose values are described by a first probability distribution function. The method can be included in an integrated circuit yield analysis tool implemented in a computer system having one or more computer processors and a computer-readable storage medium. The method includes selecting with one or more of the computer processors a first plurality of samples using a uniform distribution in the values of the plurality of parameters, performing a first test to determine an outcome for each of the first plurality of samples and identifying failed samples based on the determined outcomes, and clustering the failed samples using a computer-implemented cluster forming method that, in some cases, returns multiple clusters.

The method also includes forming with one or more of the computer processors a probability distribution function for each of the one or more clusters, forming with one or more of the computer processors a composite probability distribution function that includes a weighted combination of the first probability distribution function and the probability distribution function for each of the one or more clusters. The method further includes selecting with one or more of the computer processors a second plurality of samples using the composite probability distribution function and performing a second test with one or more of the computer processors to determine an outcome for each of the second plurality of samples. A failure probability can then be computed with one or more of the computer processors using the outcome for each of the second plurality of samples, the first probability distribution function, and the composite probability distribution function.

In another embodiment, a computer system is provided for estimating a failure probability of an integrated circuit.

In another embodiment, a computer readable storage medium includes computer code which, when retrieved and executed, results in estimating a failure probability of an integrated circuit.

In yet another embodiment, a system for estimating a failure probability of an integrated circuit includes various means for carrying out the various methods described herein.

In various embodiments, the methods and systems for analysis and estimation of integrated circuit yield and other statistical events also includes methods for reducing the number of parameters to facilitate cluster forming. Moreover, some embodiments also include methods for forming local distribution functions for more effective sampling.

A further understanding of the nature and advantages of the present invention may be realized by reference to the remaining portions of the specification and the drawings.

BRIEF DESCRIPTION OF THE DRAWINGS

FIGS. 9-14 illustrate simulation results based on a yield analysis method according to an embodiment of the present invention;

FIGS. 21 and 22 illustrate simulation results based on a yield analysis method according to an embodiment of the present invention.

DETAILED DESCRIPTION OF THE INVENTION

Figure 1:
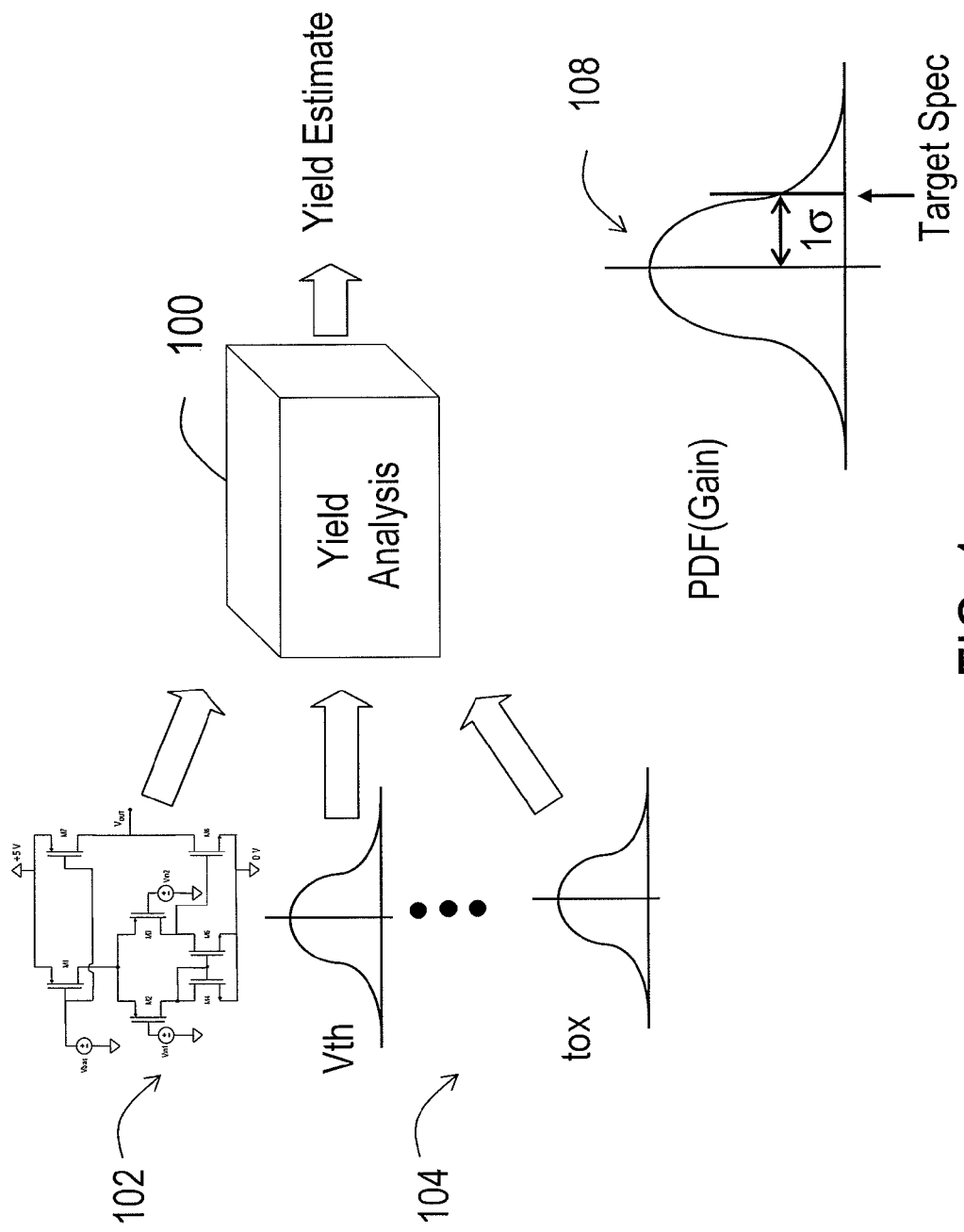
FIG. 1 is a simplified diagram illustrating an example of a yield analysis process.

FIG. 1 is a simplified diagram illustrating an example of a yield analysis process. As shown, block 100 represents a yield analysis tool, which receives as inputs a description of an integrated circuit 102 and device parameters information 104 such as threshold voltage (Vth), gate oxide thickness (tox), and others. Here circuit description 102 can include a netlist, a schematic description, a high-level design language description such as Verilog, and other forms of circuit descriptions. Device parameter information can include statistical device data which can be described in probability distribution functions. Based on the input information, yield analysis tool 100 outputs a yield estimate. As an example, yield analysis tool 100 can determine a probability distribution function (PDF) of certain circuit performance measurements, for example, a gain of circuit 102, PDF(Gain), which is shown as 108 in FIG. 1. A yield can be reported as the percentage of samples having a gain that meets a target specification.

In some examples, the circuit performance can be described by a Gaussian probability distribution function with an associated standard variations a. Then the yield of the circuit can be expressed in a. For example, a yield of "1σ" represents a yield of 84.13%. Other yield numbers can be similarly specified, as shown below.

| Yield in σ | Yield in % |
|---|---|
| 1σ | 84.13% |
| 2σ | 97.72% |
| 3σ | 99.87% |
| ... | ... |
| 6σ | 99.99999 ... % |

In integrated circuit applications, it is often a goal to achieve a very high yield. For instance, in high-volume integrated circuit manufacturing, it is often desirable to achieve a high yield over 99%, or a yield of 3σ or higher. Merely as an example, a 1 Mbit SRAM has one million individual memory cells. To achieve a 90% yield of a 1 Mbit SRAM chip, each single memory cell needs to have a failure rate of lower than 1e-5%, or to have a yield of about 5.3σ.

High yield in integrated circuit is also desired for other reasons. For example, circuit designers often seek high yield numbers to shield from non-idealities. A high yield number at the schematic level is often desired to ensure lower, yet acceptable, yield numbers after incorporating parasitics or post fabrication. Similarly, a high yield at the block level is desired to ensure high system level yield. Moreover, a high yield circuit often implies stable design and higher resistance to perturbation.

Therefore, it is desirable to be able have an effective method for yield estimation in the range of high yield. In embodiments of the invention, an integrated circuit yield estimation can be carried out by generating samples based on the probability distribution functions of the statistical variables, including relevant device parameters and running circuit simulations, using tools such as SPICE, for circuit with these generated set of values for the statistical samples, and then computing a yield as the ratio of circuits that meet the specification to the total number of samples generated.

However, a high yield often implies a low failure rate, and to provide an accurate estimation of a high yield often requires collecting samples of failure events that are relatively rare. To obtain enough statistical information about the rare events requires a large number of samples. As a result, conventional methods such as Monte Carlo simulation can be expensive. Other conventional methods also do not satisfactorily resolve the limitations of computational cost and accuracy of yield estimation.

Moreover, as we move towards finer technology nodes, the amount of variation that we observe in the statistical parameters has been increasing. In the presence of these large variations, response surfaces can be very non-linear, and can include failing regions (where the goal variable does not meet the desired specification) in the statistical space composed of multiple disjoint regions, islands, non-linear boundaries, etc.

Figure 2:
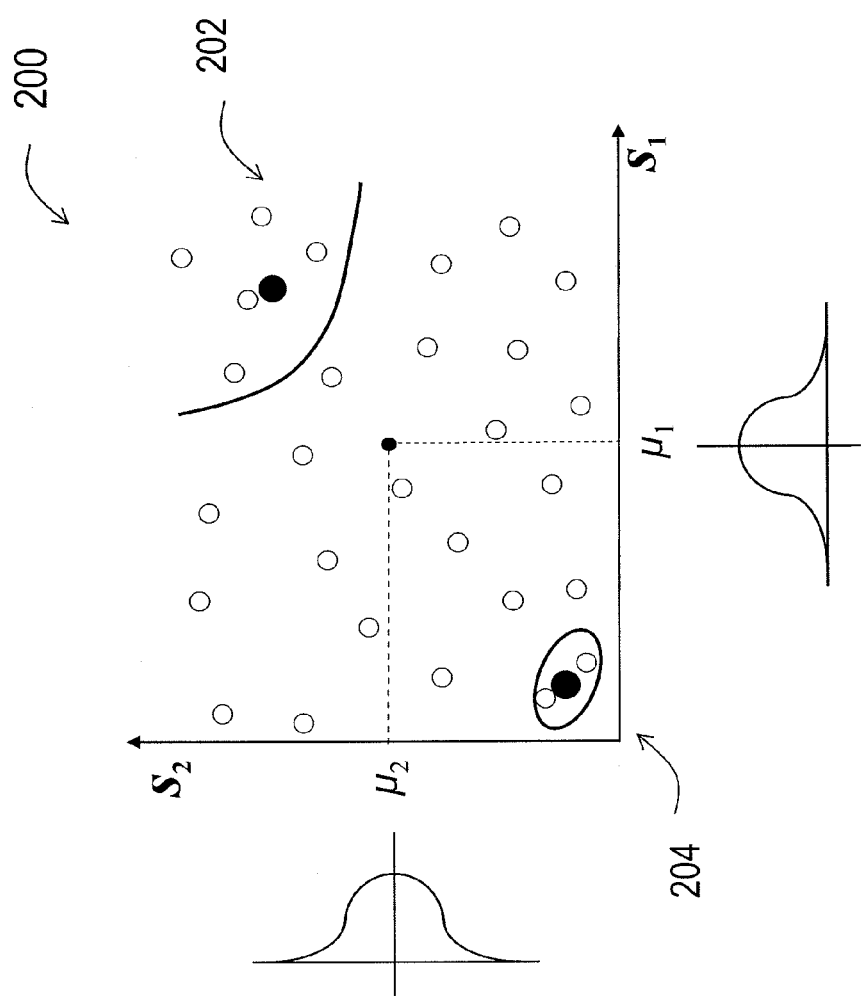
FIG. 2 is a simplified diagram illustrating an example of multiple failing regions in a parameter space.

According to embodiments of the invention, a challenge to efficient yield estimation can occur when there are multiple failing regions in the parameter space. FIG. 2 is a simplified diagram illustrating an example of multiple failing regions in a parameter space. In FIG. 2, the parameters space 200 includes two parameters S1 and S2, each having a probability distribution function with a center, at $\mu 1$ and $\mu 2$, respectively. Merely as an example, S1 and S2 may represent threshold voltage and gate oxide thickness, respectively. Good samples are shown as open circles, and failing samples are shown as dark circles. It can be seen that failing samples fall into two regions, 202 and 204, respectively.

In some embodiments of the present invention, a method is provided for estimation of parametric yield for circuits with very high yield numbers (e.g., 2.5σ or more) at the schematic level. The input to the method can be a circuit netlist (whose yield needs to be computed) along with the PDFs (Probability Density Functions) and correlation information of the statistical variables, and the output is a yield number (in percentage or σ notation) along with a confidence interval of the yield estimate. To handle multiple failing regions, the yield estimation method includes methods for (a) identifying these regions and (b) quantifying their contribution to the degradation in yield without the cost of a large number of samples.

Figure 3:
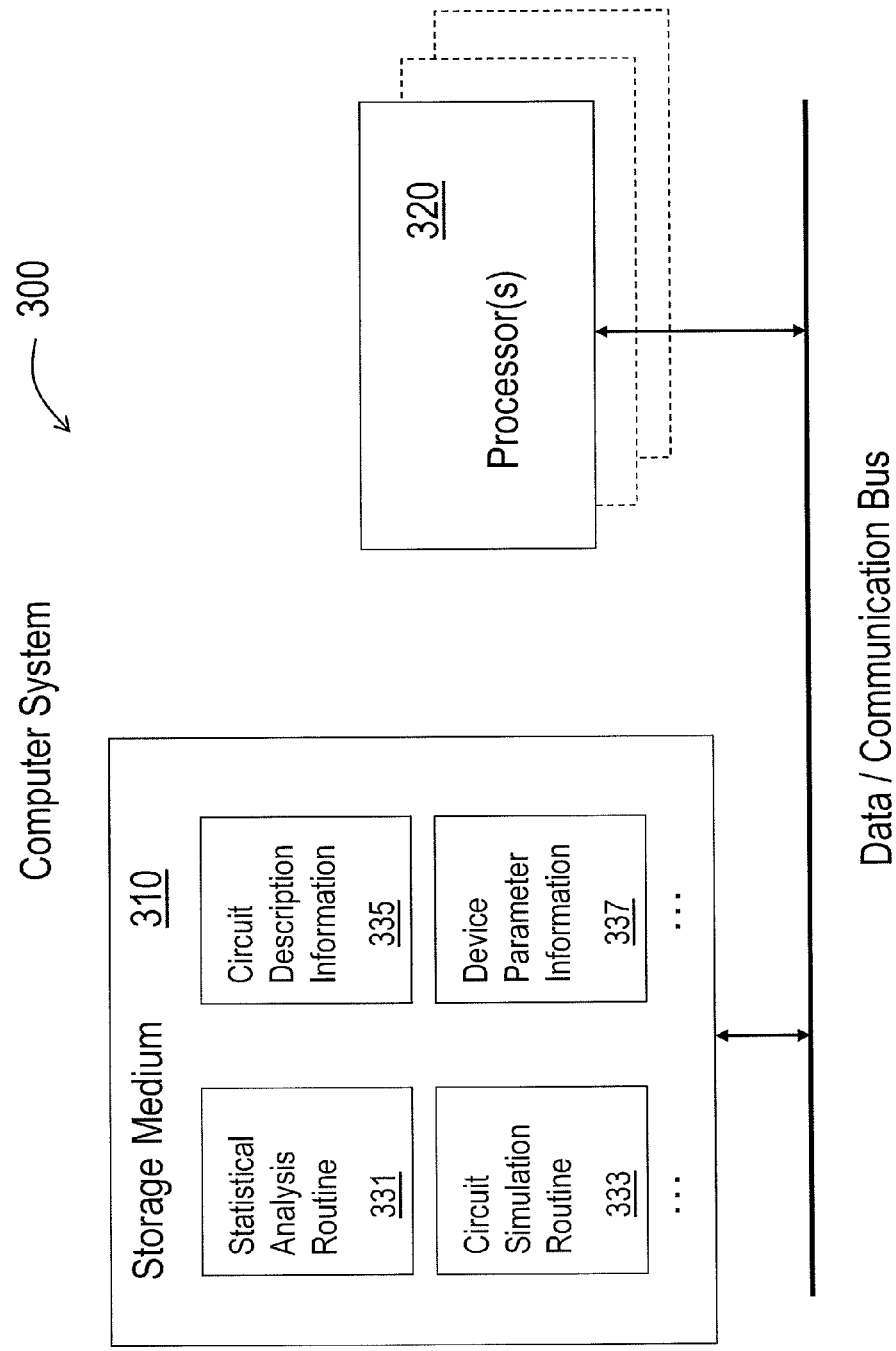
FIG. 3 is a simplified block diagram of a computer system that can be used for performing yield analysis processes according to an embodiment of the present invention.

FIG. 3 is a simplified block diagram of a computer system 300 that can be used for performing yield analysis processes according to embodiments of the present invention. As shown, computer system 300 includes a storage medium 310 and one or more processors 320 coupled to storage medium 310 through a data/communication bus. Depending on the embodiment, processor 320 may include a single processor, multiple processors, or a number of local or distributed processors operating in parallel. Storage medium 310 can include various memory and mass storage devices, such as DRAM, SRAM, non-volatile memory devices, read only memory (ROM), disk storage, optical CD, DVD, etc. Storage medium 310 is configured to store one or more computer instruction codes and data, while processor(s) 320 are configured to retrieve the code and data, and to execute the computer code. In the embodiment of FIG. 3, storage medium 310 includes computer codes such as statistical analysis routine 331 and circuit simulation routine 333. Storage medium 310 also includes various data files such as circuit description information 335 and device parameter information 337.

In some embodiments, when computer programmable instructions or code are retrieved from storage medium 310 and executed by processors 320, certain circuit yield estimation functions and other statistical event analysis functions are performed. More details of the methods for yield estimation and other probability analysis are described further below.

In some embodiments, sampling of the statistical space is followed by circuit simulation of these samples to identify the failing points. Once the failing points are identified, automatic clustering is carried out to group the points into clusters such that points belonging to disjoint failure regions in the statistical space belong to different clusters. After clustering, a center is identify of all of these clusters, for example, K centers $\mu 1, \mu 2, \ldots \mu K$ for K clusters. This procedure helps identify whether multiple failure regions exist in statistical design space. The identification of the clustering scheme can also be done via a guided search for failure regions or biased sampling of the statistical space in regions that are more prone to failure.

Once the failure regions and representative points within these failure regions ($\mu 1, \ldots \mu K$) are identified, the contribution of these regions to the yield is computed. This is done by generating samples with the distribution function that includes contributions from distribution functions that are associated with the separate regions. Then circuit simulation can be carried out using sample points generated using this distribution and compute the probability along with the confidence interval.

In embodiments of the invention, the above procedure can be recursively applied to better quantify the failure regions and hence yield computation by doing a rough sampling in the beginning and then finer sampling around the failure region to identify the failure boundary more precisely.

Figure 4:
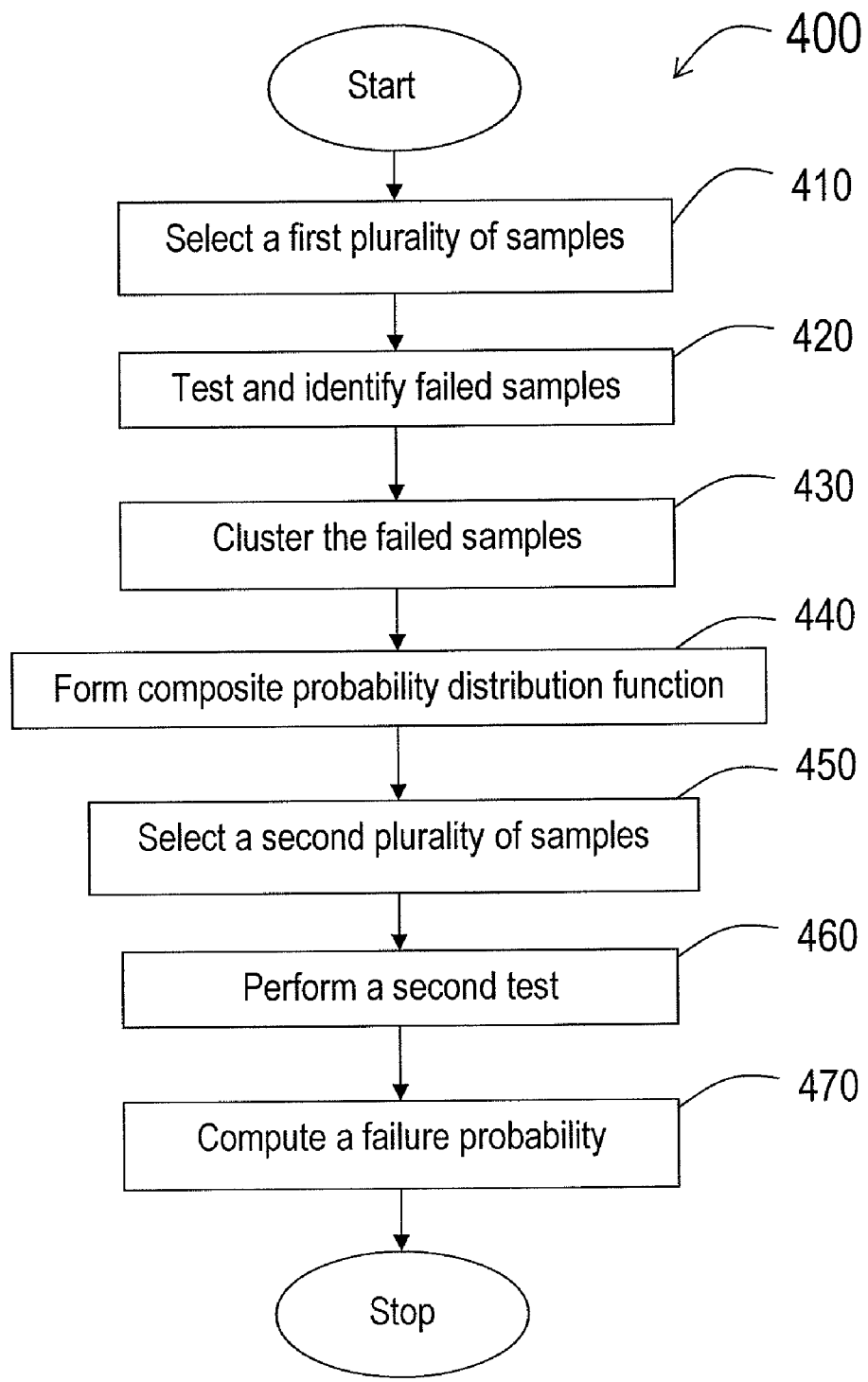
FIG. 4 is a simplified flowchart illustrating a method for yield analysis according to an embodiment of the present invention.

FIG. 4 is a simplified flowchart illustrating a method for yield analysis according to an embodiment of the present invention. Flowchart 400 in FIG. 4 illustrates a method for estimating a failure probability of an integrated circuit associated with a plurality of device parameters. In some embodiments, the method can be included in an integrated circuit yield analysis tool implemented in a computer system, such as system 300 of FIG. 3, having one or more computer processors and a computer-readable storage medium. In an integrated circuit yield analysis tool, an integrated circuit is associated with a plurality of parameters, whose values can be described by a first probability distribution function.

In an embodiment, the method for estimating a failure probability of the integrated circuit depicted in FIG. 4 can be briefly summarized below.

1. Step 410: Select a first plurality of samples, using a uniform distribution in the values of the plurality of parameters;
2. Step 420: Perform a first test to determine an outcome for each of the first plurality of samples and identifying failed samples based on the determined outcomes;
3. Step 430: Cluster the failed samples using a computer-implemented cluster forming method that, in some cases, returns multiple clusters;
4. Step 440: Form a composite probability distribution function that includes a weighted combination of the first probability distribution function, and the probability distribution function for each of the one or more clusters;
5. Step 450: Select a second plurality of samples using the composite probability distribution function;
6. Step 460: Perform a second test to determine an outcome for each of the second plurality of samples; and
7. Step 470: Compute a failure probability.

Depending on the integrated circuit and testing/modeling methodology, the device parameters can include, for example, device dimension, oxide thickness, threshold voltage, etc. The values of the parameters are described by a first probability distribution function. Depending on the embodiment, the first probability distribution function can be a multivariate function, and can be obtained from sample testing or based on historical statistical device fabrication data. Alternatively, a known probability distribution function can be used, such as a Gaussian function, Weibull function, lognormal function, uniform distribution, or combination of some of functions.

In step 410 of the method, a plurality of samples are selected for an initial screening of the sample space. In an embodiment, this selection can be carried out with one or more of the computer processors using a uniform distribution in the values of the plurality of parameters. Of course, other probability distribution function, such as a Gaussian function, can also be used.

In step 420, a first test is performed to determine an outcome for each of the first plurality of samples and to identify failed samples based on the determined outcomes. In an embodiment, the test can be carried out by computer simulation in which each sample is represented by a set of parameters, a circuit function is computed by simulation, and failed samples are identified according to a circuit function target. In another embodiment, the test can be carried out by electrical testing and test results are associated with measured device parameters.

In step 430, the failed samples are clustered into one or more clusters using a computer-implemented cluster forming method that, in some cases, returns multiple clusters. Various clustering methods can be used. In an embodiment, the cluster forming method can be described as follows:

Start with each element in its own cluster;
Among all clusters merge two clusters with smallest distance; and
Repeat until we are left with acceptable number of clusters.
Here, each cluster has an associated center that is represented by the average values of the plurality of parameters of all samples in the cluster, and the distance between two clusters can be defined as the distance between the centers of the two clusters.

In an embodiment, the cluster forming method includes iteratively merging two of the clusters having the shortest distance until a desired number of clusters are formed. In another embodiment, the clusters can be formed based on a stopping criterion. The method starts with large number of clusters, and the number of clusters is repeatedly reduced (e.g., by merging clusters) until a certain stopping criterion is met, for example, until the distance between any two clusters is more than twice the distance between the center of any cluster and samples within that cluster. This condition can be express mathematically as follows:

$$D(\mu_{S1}-\mu_{S2}) > 2 * \max\{D(p-\mu_p)\} \qquad \text{(Eq. 1)}$$

In a specific example, the cluster forming method can include the following steps:
Associate each failed sample with a cluster;
Determine a distance between each pair of clusters; and
Merge two of the clusters having the shortest distance; and Form with one or more of the computer processors a probability distribution function for each of the one or more clusters.

Figure 5:
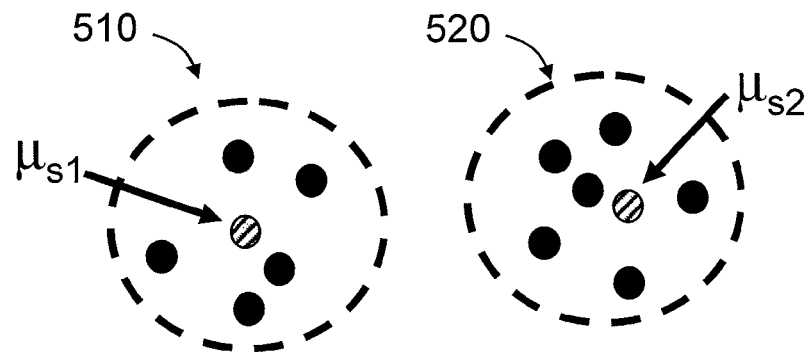
FIGS. 5-7 are simplified diagrams illustrating cluster forming methods according to an embodiment of the present invention.
Figure 6:
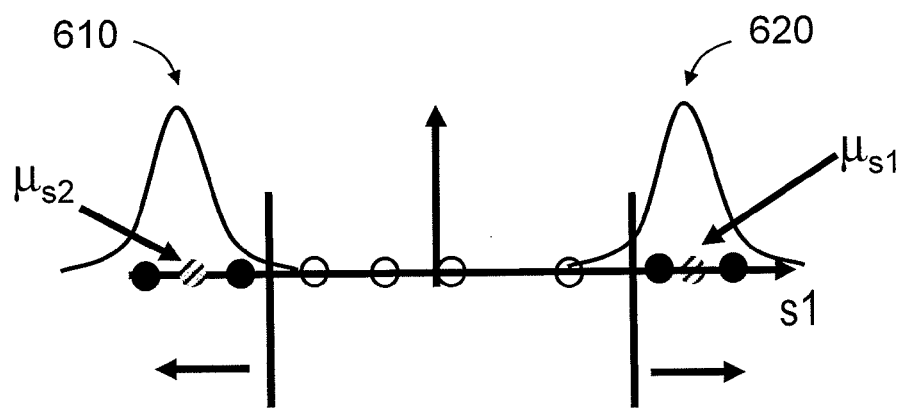
Figure 7:
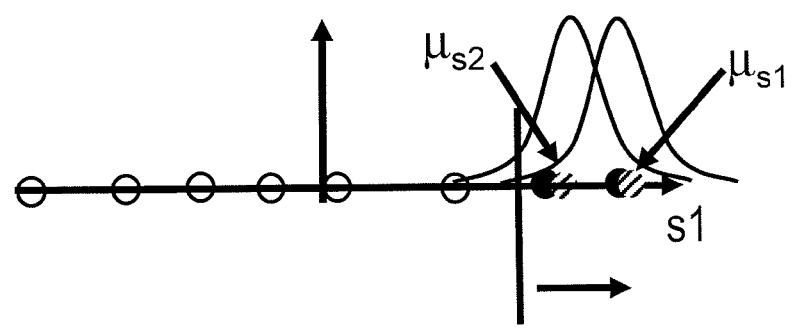

FIGS. 5-7 are simplified diagrams illustrating cluster forming methods according to embodiments of the present invention. FIG. 5 shows two clusters 510 and 520, each including a group of failing samples. Clusters 510 and 520 have associated center points, $\mu_{s1}$ and $\mu_{s2}$, respectively. In this embodiment, the center is represented by the average values of the plurality of parameters of all samples in the cluster. In other embodiments, an alternative representative point can be selected for the cluster in the parameter space. For example, a point determined by weighted coordinates of all samples in the cluster would favor a heavily populated sub-region. In yet another embodiment, a point at a boundary of the cluster can be used as the representative point for the cluster.

FIG. 6 illustrates that probability distribution functions 610 and 620 are formed, one for each cluster. In an embodiment, the distribution function can be a Gaussian function with a mean at the cluster center. The method uses clustering to identify disjoint regions of failing samples, as shown in FIGS. 5 and 6. In some cases, some of the clusters may overlap as shown in FIG. 7. However, the overlapped clusters do not affect the effectiveness of the method described in embodiments of the invention.

In step 440, a composite probability distribution function is formed that includes a weighted combination of the first probability distribution function, and the probability distribution function for each of the one or more clusters. As described above, the values of the parameters in the sample space are described by a first probability distribution function. In some embodiments, the probability distribution function for a cluster can be formed using the same function as the first probability distribution function, but shifted to the center point of the cluster. In this case, the composite probability function can be expressed as follows:

$$g_\lambda(x) = \lambda_1 p(x) + \lambda_2 U(x) + \frac{(1 - \lambda_1 - \lambda_2)}{K} \sum_{i=1}^{K} p(x - \mu_{si}) \quad \text{(Eq. 2)}$$

where:
$g_\lambda$ is the composite probability distribution function;
p is the first probability distribution function;
U is a uniform probability distribution function;
$\mu_{si}$ is the center of cluster i;
K is the number of clusters of failing samples; and
$\lambda_1$ and $\lambda_2$ are selectable parameters.

In Eq. 2, weighting parameters $\lambda_1$ and $\lambda_2$ can be selected for effective sampling. For example, small values of $\lambda_1$ and $\lambda_2$, for example, 0.1, allow more failing samples to be selected. In a specific embodiment, the first probability distribution function can be a Gaussian function, and the probability distribution function for each cluster can be represented by a Gaussian function having a mean at the representative point for each cluster. In some embodiments, the uniform distribution function can be omitted from the composite probability distribution function. Of course, there can be other variations and alternatives.

Figure 8:
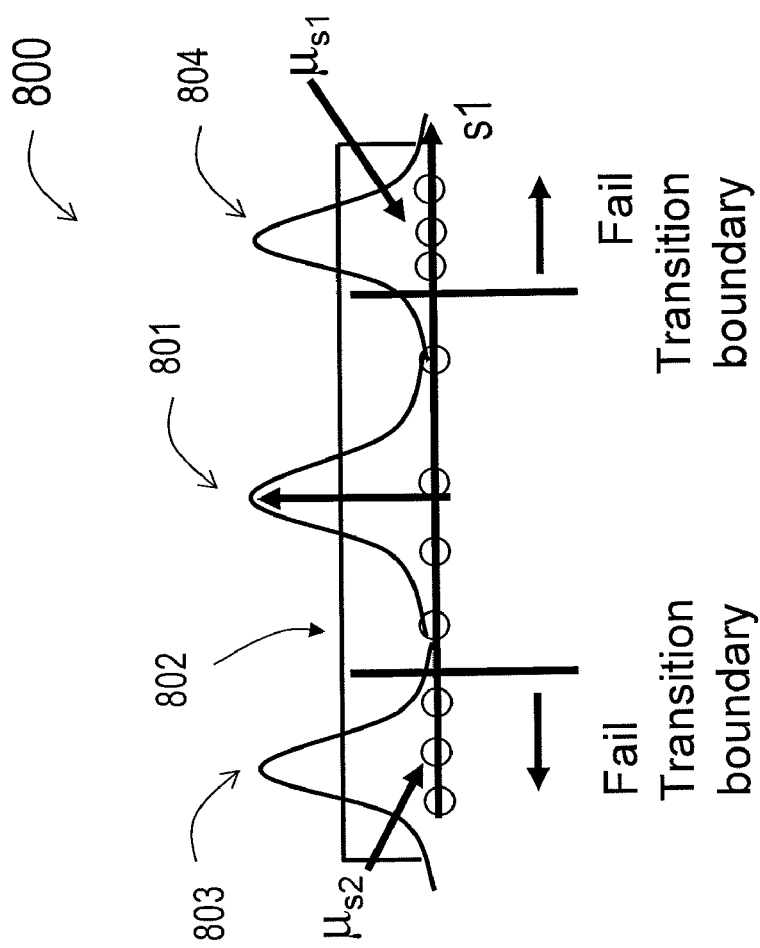
FIG. 8 is a simplified diagram illustrating a method for forming a composite probability distribution function according to an embodiment of the present invention.

FIG. 8 is a simplified diagram illustrating a method for forming a composite probability distribution function according to an embodiment of the present invention. As shown, the components of the composite probability distribution function 800 includes the first probability distribution function 801, a uniform probability distribution function 802, and probability distribution functions 803 and 804 for the clusters.

In step 450, a second plurality of samples are selected using the composite probability distribution function. In some embodiments, the selection can be carried out with one or more of the computer processors to generate various combinations of parameter values for the samples according to the composite probability distribution function and a second plurality of samples using the composite probability distribution function.

In step 460, a second test is performed to determine an outcome for each of the second plurality of samples. In some embodiments the test can be carried out using simulation with one or more of the computer processors.

In step 470, a failure probability can be computed with one or more of the computer processors using the outcome for each of the second plurality of samples, the first probability distribution function, and the composite probability distribution function. In an embodiment, the failure probability can be expressed as follows:

$$P_f = \frac{\sum_{i=1}^{N} \frac{p(x^i)}{g_\lambda(x^i)} I(x^i)}{\sum_{i=1}^{N} \frac{p(x^i)}{g_\lambda(x^i)}} \quad \text{(Eq. 3)}$$

where:
$g_\lambda$ is the composite probability distribution function;
p is the first probability distribution function;
I is an outcome for sample $x^i$; and
N is the total number of samples.

In Eq. 3, I is an outcome for sample $x^i$. For example, in a computation for integrated circuit failure rate, the value for $I(x^i)$ can be "1" for each failing sample and "0" for each passing sample. As described below, Eq; 3 can also be used to compute the probability of a statistical event. In this case, the value for $I(x^i)$ can be "1" for each sample belonging to the event and "0" for each sample outside the event.

A variance of the failure probability can be expressed as follows:

$$\sigma_{P_f}^2 = \frac{1}{N(N-1)} \frac{1}{\frac{1}{N}\sum_{i=1}^{N} \frac{p(x^i)}{g_\lambda(x^i)}} \sum_{i=1}^{N} \left( \frac{p(x^i)}{g_\lambda(x^i)} I(x^i) - P_f \frac{p(x^i)}{g_\lambda(x^i)} \right)^2 \quad \text{(Eq. 4)}$$

where:
$g_\lambda$ is the composite probability distribution function;
p is the first probability distribution function;
I is an outcome for sample $x^i$; and
N is the total number of samples.

From Eq. 3, an estimate of yield can be determined as follows:

$$\text{Yield} = 1 - P_f \quad \text{(Eq. 5)}$$

An expression for the variance of the estimated yield is the same as Eq. 4.

To evaluate the methods described above, we performed various simulation studies. FIGS. 9-14 illustrate results from simulation studies based on the yield analysis methods described above. FIGS. 9 and 10 list mathematical functions that represent various distribution functions of failing samples. FIG. 9 includes linear or weakly non-linear mathematical functions, and FIG. 10 includes non-linear mathematical functions. FIGS. 11 and 12 list simulation results of yield estimation from embodiments of the present invention as compared to those obtained from three conventional techniques.

Monte Carlo (MC) method, which samples statistical parameters based on their probability density functions and counts percentage of the circuits that meet performance specifications.

Worst case distance (WCD) method, which makes use of worst corner formulation and sensitivity analysis.

Mixed Importance Sampling (MixIS) method, which uses a mixture of distributions.

In these studies, five million samples were used in the Monte Carlo method, 2000 samples were used in the MixIS method, and 10 iterations were used in the WCD method. 2000 samples were also used in the methods based on embodiments of the invention. FIG. 11 lists the yield (in σ) for each case, with the 95% confidence interval also include in columns 2 and 5. As can be seen in FIG. 11, the results from embodiments of the invention are substantially similar to the results with the much more costly Monte Carlo method in both the yield estimate (in σ) and the confidence interval estimate. For the linear or weakly non-linear mathematical functions listed in FIG. 11, the WCD and the MixIS methods generally produced acceptable results with a few exceptions. However, for the non-linear functions listed in FIG. 12, the WCD and MixIS methods produced several unacceptable results.

In another embodiment of the present invention, the methods of clustering and circuit simulation described above are combined in an automatic computer software tool running on one or more computer processors. In an example, a processor circuit was used to evaluate these methods. FIGS. 13-14 compare results of an embodiment of the invention with those of conventional methods. In FIG. 13, the test circuit is a microprocessor circuit, and the column "Goal ID" lists several circuit performance targets used to determine circuit yield. In FIG. 14, four different circuits are included in the study. It can be seen that the method based on embodiments of the invention compares favorably with the Monte Carlo method and the WCD method. In FIG. 14, the Monte Carlo methods needed 10K-100K numerical simulations, and our method only needed about 200 simulations.

As shown above, the methods described in the embodiments provide significant accuracy improvements in yield estimates with much fewer transistor level simulations. The methods also can handle cases where there are multiple failure regions in the statistical space. Additionally, the methods can be used to handle arbitrary shapes of these failure regions.

The yield estimation methods described above in connections with FIGS. 1-14 have been described using integrated circuit yield estimation as an example. However, the methods can be applied to estimating the likelihood of any event associated with a set of parameters having probabilistic distributions. The methods are useful, for example, when a high degree of accuracy of the likelihood is desired. Examples of such events can include, for example, the probability of a disease based on parameters such as genetic and health related data, or forecast of an economic event based on parameters such as financial and non-financial data, etc.

Figure 15:
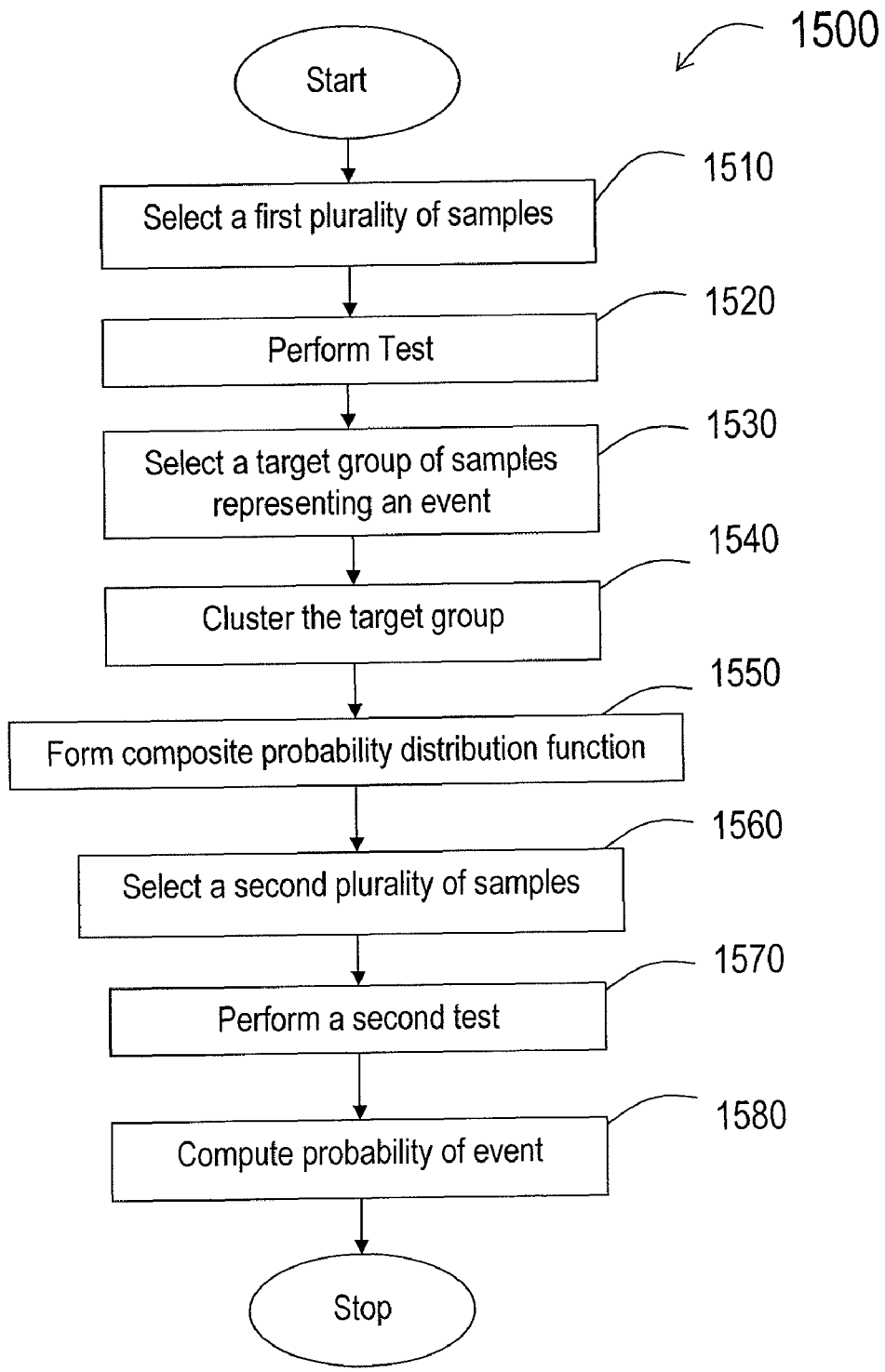
FIG. 15 is a simplified flowchart illustrating a method for estimating the likelihood of a statistical event according to an embodiment of the present invention.

FIG. 15 is a simplified flowchart illustrating a method for estimating the likelihood of a statistical event according to an embodiment of the present invention. Flowchart 1500 illustrates a method for estimating a probability of an event that is associated with a first plurality of parameters and the values of the parameters are described by a first probability distribution function. The method can be included in an analysis tool implemented in a computer system having one or more computer processors and a computer-readable storage medium. The method includes the following steps:

1. Step 1510: Select a first plurality of samples using a uniform distribution of the values of the plurality of parameters;
2. Step 1520: Perform a first test to determine an outcome for each of the selected samples;
3. Step 1530: Select a target group of samples based on the determined outcomes, the target group of samples being associated with the event;
4. Step 1540: Cluster the target group of samples using a computer-implemented cluster forming method that, in some cases, returns multiple clusters;
5. Step 1550: Form a composite probability distribution function that includes a weighted combination of the first probability distribution function and the probability distribution function for each of the one or more clusters;
6. Step 1560: Select with one or more of the computer processors a second plurality of samples using the composite probability distribution function;
7. Step 1570: Perform a second test to determining an outcome for each of the second plurality of event samples; and
8. Step 1580: Compute with one or more of the computer processors a probability of the event representing the target group of samples using the outcome of each of the second plurality of samples, the first probability distribution function, and the composite probability distribution function.

In Step 1530, a target group of samples is selected based on the determined outcomes of the first test, with the target group of samples associated with the event. Here, depending on the embodiment, the event can be defined to represent a group of samples characterized by certain range of outcomes of the test. Further details of the method of FIG. 15 are similar to those described above in connections with FIGS. 1-14. For example, the first test can include computer simulation in a specific embodiment. In another embodiment, each cluster has a center that is represented by the average values of the plurality of parameters of all samples in the cluster. In another embodiment, the cluster forming method further includes iteratively merging two of the clusters having the shortest distance until a desired number of clusters are formed. In another embodiment, the cluster forming method includes iteratively merging clusters until the distance between any two clusters is more than twice the distance between the center of any cluster and samples within that cluster.

In another embodiment of the method of FIG. 15, forming a probability distribution function for each of the one or more clusters includes selecting a representative point for the cluster in the parameter space and forming the probability distribution function for the cluster by shifting a mean of the first probability function to the representative point. In another embodiment, the first probability distribution function is a Gaussian function, and the probability distribution function for each cluster is a Gaussian function having a mean at the representative point for each cluster. In another embodiment, the composite probability distribution function further comprises a uniform probability distribution function. In some embodiments, the composite probability distribution function can be expressed by Eq. 2, and the probability of the event is expressed by Eq. 3. In an embodiment, when Eq. 3 is used to compute the probability of an event, the value for $I(x^i)$ can be "1" for each sample belonging to the event and "0" for each sample outside the event.

Figure 16:
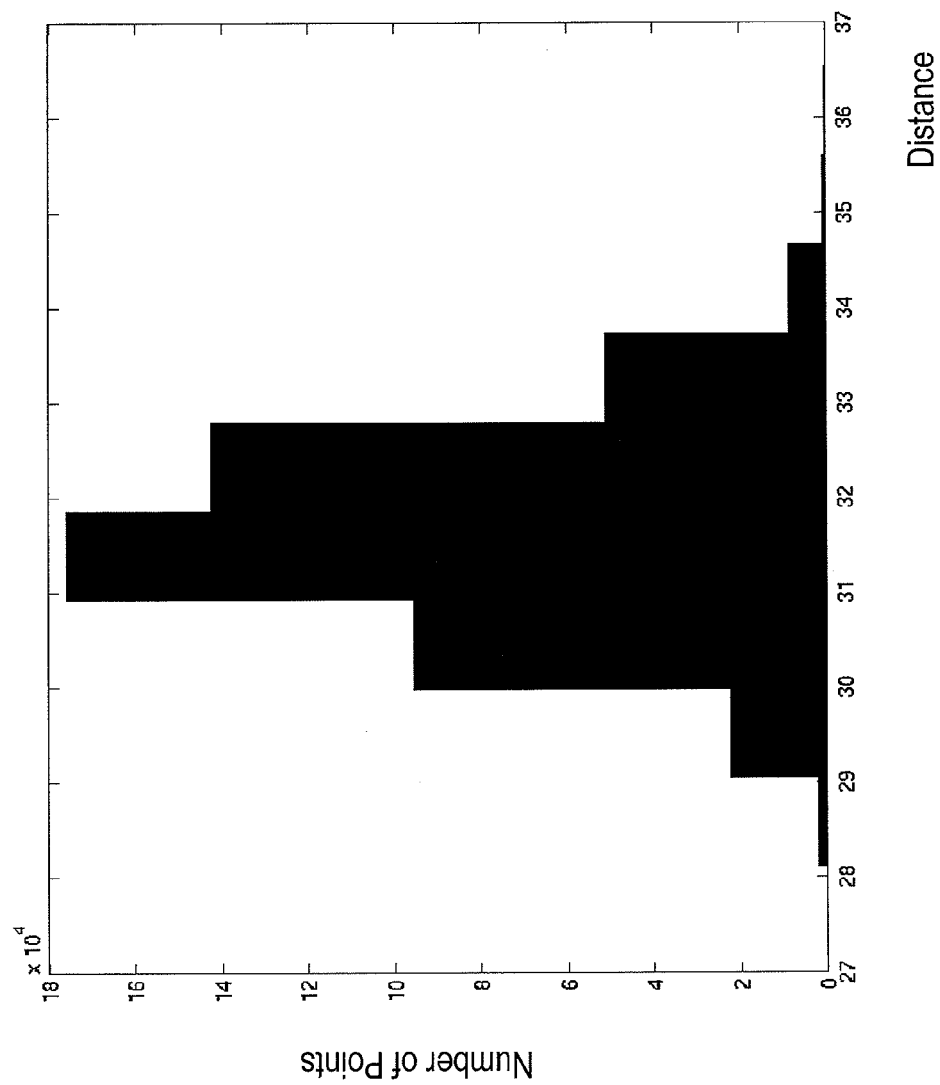
FIG. 16 is a simplified histogram illustrating a distribution of distances between samples in a space of a large number of parameters.

According to some embodiments of the present invention, when the number of parameters are large, for example, over 300-400 parameters in some circuit simulations, it can become difficult to identify disjoint clusters of failing samples. If device mismatch is taken into account, the number of parameters could exceed 1000 or even tens of thousands. FIG. 16 is a simplified histogram illustrating a distribution of pair-wise distances of 1,000 normally distributed samples in a parameter space of 500 parameters. It can be seen that the sample do not form disjoint clusters.

In some embodiments of the present invention, cluster-based sampling methods include additional features, such as a method for reducing the number of parameters used in cluster formation and a method for forming a distribution function for each cluster. According to embodiments of the invention, reducing the number of parameters, or the dimensionality of the parameter space, can make clustering more effective in identifying disjoint clusters.

Figure 17:
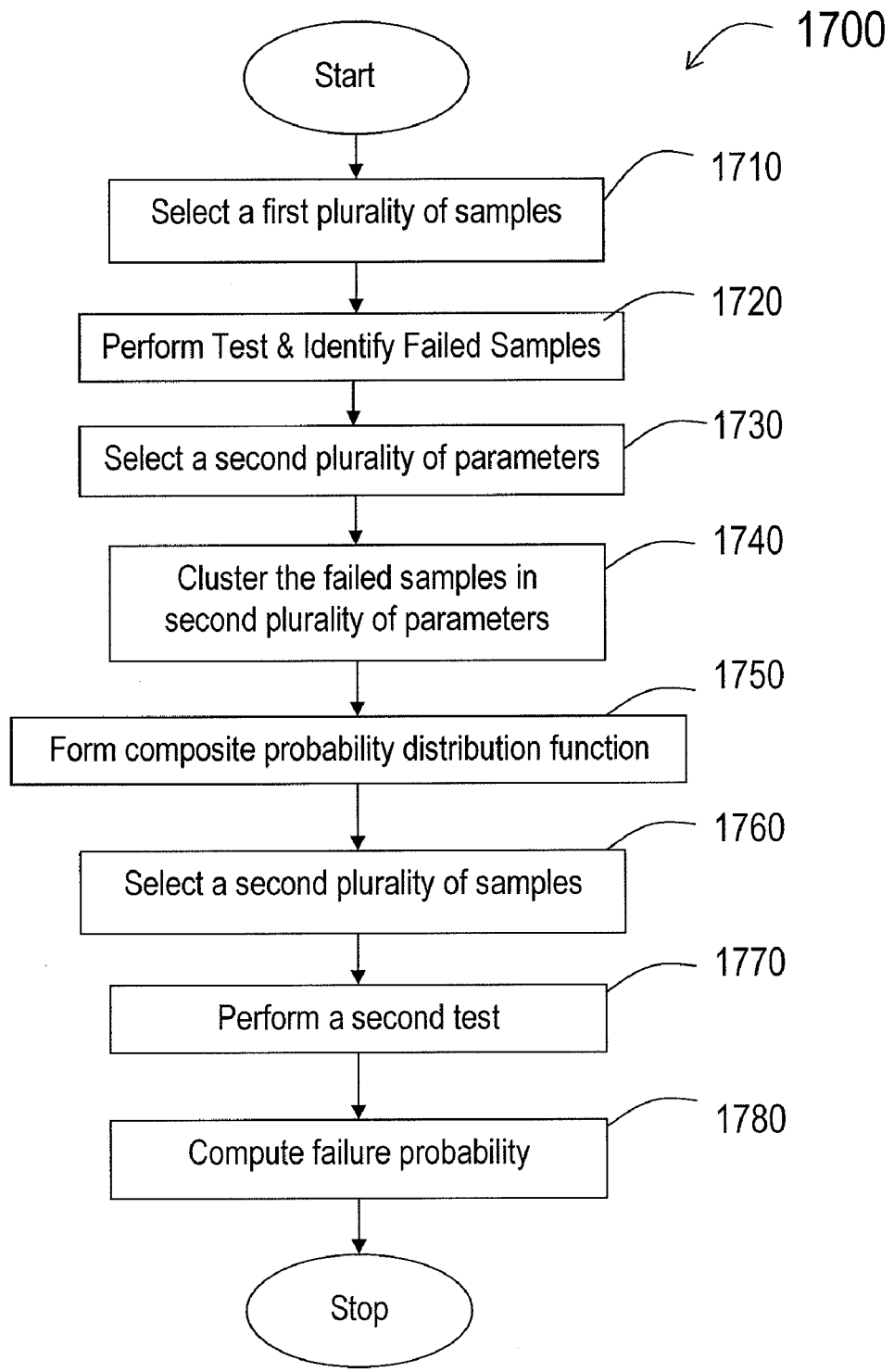
FIG. 17 is a simplified flowchart illustrating a method for yield analysis according to an alternative embodiment of the present invention.

FIG. 17 is a simplified flowchart 1700 illustrating a method for yield analysis according to an alternative embodiment of the present invention. Flowchart 1700 illustrates a method for estimating a failure probability of an integrated circuit associated with a plurality of parameters. In some embodiments, the method can be included in an integrated circuit yield analysis tool implemented in a computer system, such as system 300 of FIG. 3, having one or more computer processors and a computer-readable storage medium.

In an embodiment, the method as listed in FIG. 17 can be briefly summarized below:

Step 1710: Select a first plurality of samples, using a uniform distribution in the values of the plurality of parameters;

Step 1720: Perform a first test to determine an outcome for each of the first plurality of samples and identifying failed samples based on the determined outcomes;

Step 1730: Select with one or more of the computer processors a second plurality of parameters having fewer parameters than the first plurality of parameters;

Step 1740: Cluster the failed samples in the space of the second plurality of parameters using a computer-implemented cluster forming method that, in some cases, returns multiple clusters;

Step 1750: Form a composite probability distribution function that includes a weighted combination of the first probability distribution function, and the probability distribution function for each of the one or more clusters;

Step 1760: Select a second plurality of samples using the composite probability distribution function;

Step 1770: Perform a second test to determine an outcome for each of the second plurality of samples; and Step 1780: Compute a failure probability.

In step 1710, a first plurality of samples are selected, using a uniform distribution in the values of the plurality of parameters in an embodiment. In other embodiments, alternative methods of selecting samples for the screening test can also be used. In step 1720, a first test is performed to determine an outcome for each of the first plurality of samples, and failed samples are identified based on the determined outcomes. Steps 1710 and 1720 are similar to steps 410 and 420 of FIG. 4. Further details can be found in the description in connection with the method of FIG. 4.

In step 1730, the dimensionality of the estimation problem is reduced by selecting a second plurality of parameters having fewer parameters than the first plurality of parameters. This selection process can be performed using one or more of the computer processors. Some embodiments of the invention include selecting a subset of parameters from the parameter sampling space that are most effective in identifying the features of the target samples. In some embodiments, the method of selecting a second plurality of parameters includes forming a basis representation of the result of the first test using the first plurality of parameters, and selecting a subset of the parameters whose coefficients are larger than a threshold value. Depending on the embodiment, the basis representation can include one or more of sinusoid, polynomial, or exponentials functions. Of course, other basis functions or combination of basis function can also be used in different embodiments.

In an embodiment, the method includes forming a polynomial representation of the result of a first test using the first plurality of parameters and selecting a subset of the parameters for the polynomial whose coefficients are larger than a threshold value. In another embodiment, the method includes reducing the number of the smallest coefficients in the polynomial until the number of remaining parameters reaches an acceptable threshold.

In yet another embodiment, the method includes reducing the number of non-zero coefficients in the polynomial. For example, assume that the test result can be represented by a linear function with N variables:

$$F(x)=a1*x1+a2*x2+\ldots+aN*xN \quad \text{(Eq. 6)}$$

Then at least N samples of (F,X) are needed to determine the coefficients. On the other hand, if the number of non-zero coefficients is K, where K<<N, then only approximately Klog(N) samples are needed to determine the K coefficients, making the computation more efficient. However, the underlying function need not be linear, and it can include higher order polynomials and other functions, such as sine, cosine, etc. These methods can help find the more important variables that affect performance and can help to reduce the computational cost of high dimensionality A method for reducing the number of parameters in a sampling space according to an embodiment of the present invention starts by selecting a first plurality of samples using a uniform distribution function for the first plurality of parameters. Alternatively, another probability distribution function can also be used. A first test is then carried out to determine an outcome for each of the first plurality of samples, and failed samples are identified based on the determined outcomes. The method of selecting a second plurality of parameters, which includes few samples than the first plurality of samples, includes the following steps.

1. Form a polynomial representation of the result of the first test using the first plurality of parameters;
2. Form a first vector representing the outcome of testing the first plurality of samples;
3. Select a parameter from the first plurality of parameters that best represents the first vector;
4. Project the first vector onto the selected parameter;
5. Subtract the projected vector from the first vector to form a second vector; and
6. Repeat the above selecting, projecting, and subtracting steps using unselected parameters, until a magnitude of the second vector is smaller than a target reference, wherein the selected parameters constitute the second plurality of parameters.

Figure 18:
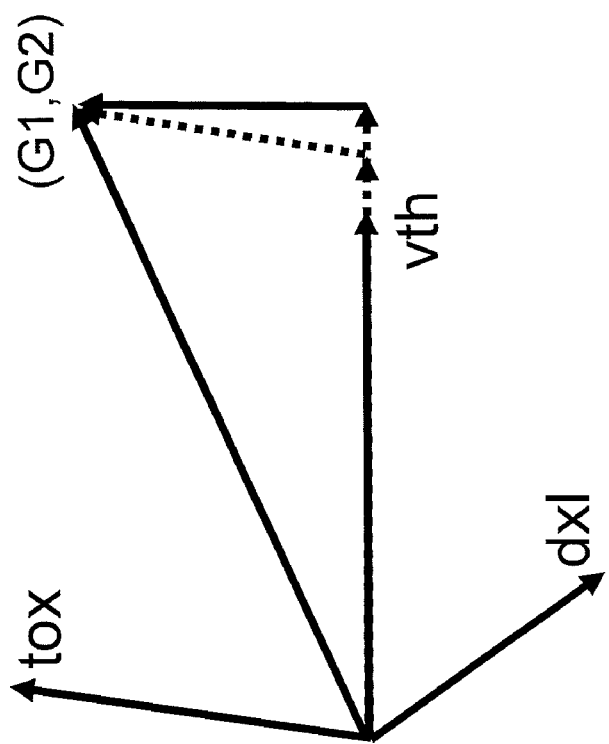
FIG. 18 is a simplified diagram illustrating a method for reducing the number of parameters in a sampling space according to an embodiment of the present invention.

FIG. 18 is a simplified diagram illustrating the method for reducing the number of parameters in a sampling space described above according to an embodiment of the present invention. As shown, a polynomial G is formed using three parameters: threshold voltage (vth), gate oxide thickness (tox), and device dimension (dx1):

$$G = a1*vth + a2*tox + a3*dx1 \qquad \text{Eq. 7}$$

Assuming two measurements are available: (G1, vth1, tox1, dxl1), and (G2, vth2, tox2, dxl2), the method can be described as follows:

1. Start: let residue vector=(G1,G2);
2. Select variable that best represents residue—by finding the parameter with maximum inner product (dot product) with the residue vector;
3. Project (G1,G2) onto the selected parameter;
4. Compute a new residue vector, which is obtained by subtracting the projection from the old residue vector;
5. If residue<$\epsilon$, the process ends, where $\epsilon$ is a desired target reference; otherwise, the process repeats from step 2.

When the above process is finished, the parameters that have been selected form the second plurality of parameters. The reduced number of parameters makes subsequent processes, such as cluster formation, less expensive.

With the number of parameters reduced, clusters can be formed in the reduced parameter space. In step 1740 of flowchart 1700 in FIG. 17, the failed samples in the space of the second plurality of parameters are clustered using a computer-implemented cluster forming method that, in some cases, returns multiple clusters. For this purpose, the various cluster forming methods described above in connection with FIG. 4 can be used.

In step 1750, the method includes forming a composite probability distribution function that includes a weighted combination of the first probability distribution function, and the probability distribution function for each of the one or more clusters. In an embodiment, these probability distribution functions are formed in the first plurality of parameters. In step 1760, a second plurality of samples are selected using the composite probability distribution function. In step 1770, a second test is performed to determine an outcome for each of the second plurality of samples. In step 1780, a failure probability is computed.

According to some embodiments of the invention, various methods can be used to select a representative point for each cluster used in step 1750. For example, the center point determined by the average coordinates of the samples can be used. In an embodiment, the representative point is selected such that the probability of failure for the shifted distribution is 0.5.

Figure 20:
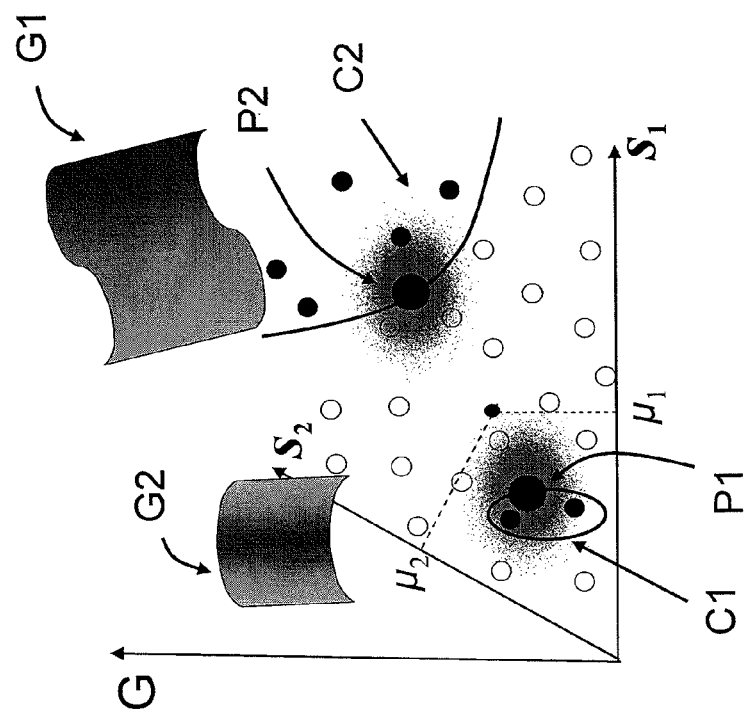
FIGS. 19 and 20 are simplified diagrams illustrating a method of selecting a representative point for a cluster in a sampling space according to an embodiment of the present invention.
Figure 19:
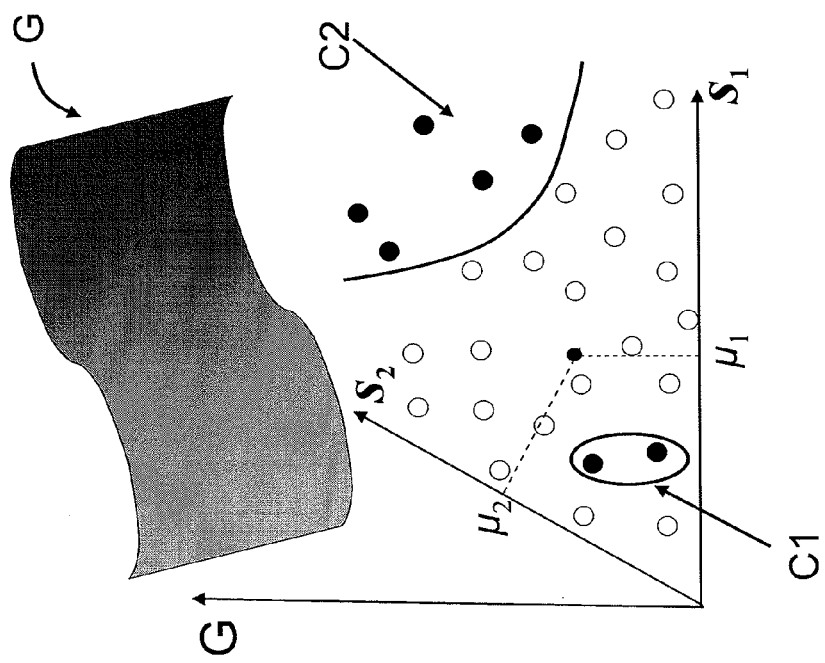

FIGS. 19 and 20 are simplified diagrams illustrating a method for selecting a representative point for a cluster in a sampling space according to an embodiment of the present invention. In FIG. 19, the sampling space is shown as having two parameters S1 and S2 and a center point µ1. The test result of all the samples is represented by polynomial G in the sampling space. As shown, two clusters C1 and C2 are formed to include the target samples shown as dark circles. In an embodiment for circuit yield application, the target samples represent the failing samples.

In FIG. 20, two local polynomials, G1 and G2, are formed to represent clusters C1 and C2, respectively. In an embodiment, polynomials G1 and G2 have the same foam as polynomial G. Next, a representative point in each cluster is chosen using the polynomial for the cluster. In one embodiment, the representative point for the cluster is based on a point in the polynomial that exhibit the largest rate of change. In some embodiments, the representative point can be at the boundary of the cluster. In FIG. 21, the representative points for clusters C1 and C2 are shown as P1 and P2, respectively.

Further details of steps 1710-1780 be found in the description of steps 410-470 of FIG. As noted above, the method of FIG. 17 includes additional features, such as the clusters being formed in the reduced parameter space and the local probability distribution functions being formed using the alternative representative point selection method.

To evaluate the methods described above, various simulation studies were performed, and the results are included in FIGS. 21 and 22. FIG. 21 lists simulation results based on mathematical functions that represent various distribution functions of sample parameters. Results from embodiments of embodiments of the present invention were compared to those obtained from conventional Monte Carlo techniques. In FIG. 21, four type of functions were included: linear, linear+quadratic, sinusoidal, and sinusoidal+linear. Three different numbers of dimensions (or parameters) were used in cluster formation: 50, 100, 500. Using methods described above, the reduced parameter space has about 5-60 important dimensions. The mathematical functions were generated with function coefficients selected by generating random number between 0 and 1. In some cases, the coefficients were scaled by 1000, if they were associated with unimportant dimensions. In the studies, the Monte Carlo method required 1,000,000 samples. As shown in FIG. 21, the particular embodiment of the invention produced results (Yield) comparable to those obtained by the Monte Carlo method (MC Yield), but needed only 1000 samples for uniform sampling and 1000 samples for cluster sampling.

FIG. 22 lists simulation results of yield estimate based on representative circuits. Again, an embodiment of the invention produced results (Yield) were comparable to those obtained by the Monte Carlo method (MC Yield), but at a much less computational cost.

The yield estimation methods described above in connections with FIGS. 17-22 can be extended to estimating the likelihood of any event associated with a set of parameters having probabilistic distributions. The method is useful, for example, when a high degree of accuracy of the likelihood is desired.

Figure 23:
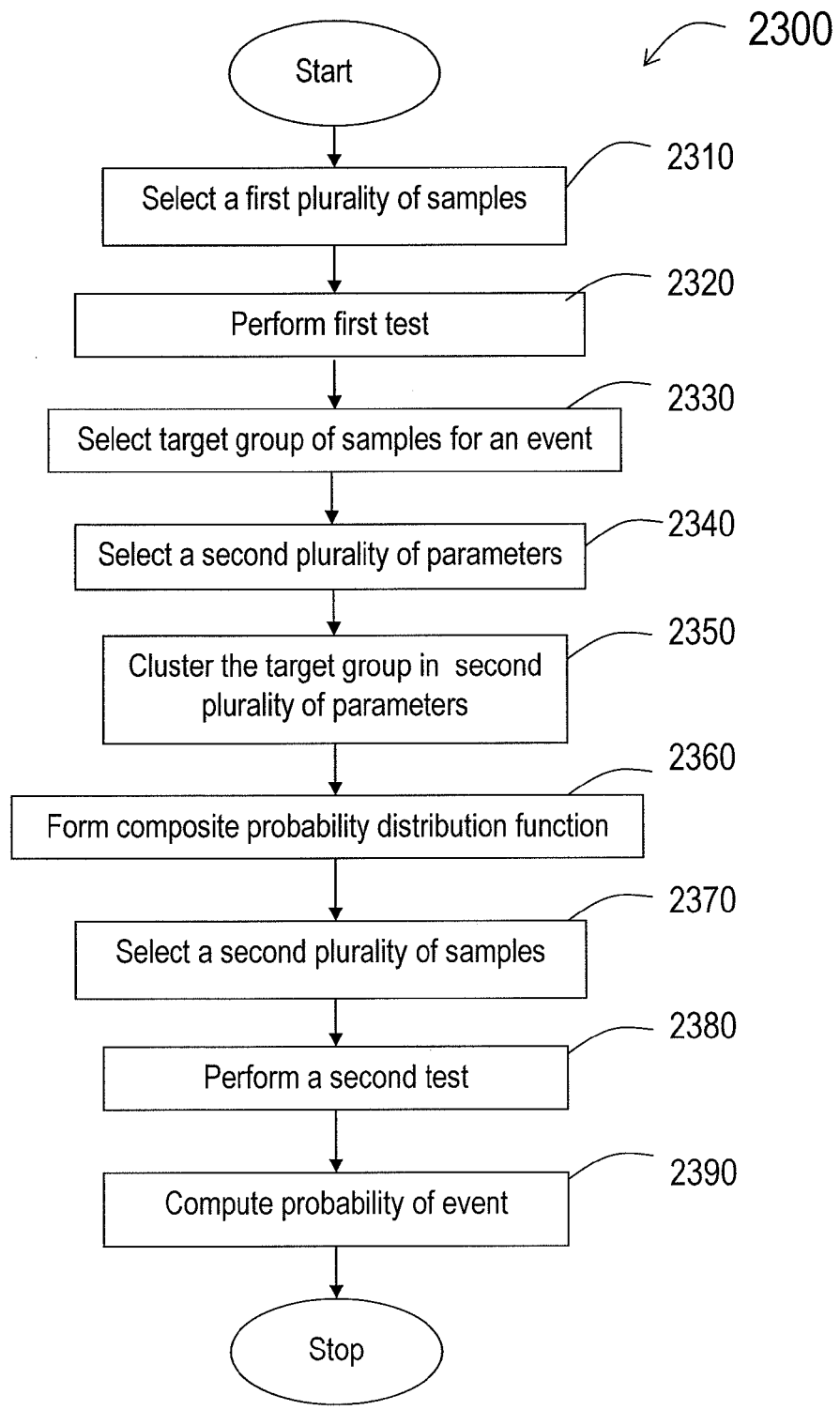
FIG. 23 is a simplified flowchart illustrating a method for estimating the likelihood of a statistical event according to an alternative embodiment of the present invention.

FIG. 23 is a simplified flowchart illustrating a method for estimating the likelihood of a statistical event according to an alternative embodiment of the present invention. Flowchart 2300 illustrates a method for estimating a probability of an event that is associated with a first plurality of parameters and the values of the parameters are described by a first probability distribution function. The method can be included in an analysis tool implemented in a computer system having one or more computer processors and a computer-readable storage medium. The method includes the following steps:

1. Step 2310: Select a first plurality of samples using a uniform distribution of the values of the plurality of parameters;
2. Step 2320: Perform a first test to determine an outcome for each of the selected samples;
3. Step 2330: Select a target group of samples based on the determined outcomes, the target group of samples being associated with the event;
4. Step 2340: Select with one or more of the computer processors a second plurality of parameters having fewer parameters than the first plurality of parameters;
5. Step 2350: Cluster the target group of samples in the space of the second plurality of parameters using a computer-implemented cluster forming method that, in some cases, returns multiple clusters;
6. Step 2360: Form with one or more of the computer processors a composite probability distribution function that includes a weighted combination of the first probability distribution function and the probability distribution function for each of the one or more clusters;

7. Step 2370: Select a second plurality of samples using the composite probability distribution function;
8. Step 2380: Perform a second test to determining an outcome for each of the second plurality of event samples; and
9. Step 2390: Compute with one or more of the computer processors a probability of the event representing the target group of samples using the outcome of each of the second plurality of samples, the first probability distribution function, and the composite probability distribution function.

In Step 2330, a target group of samples is selected based on the determined outcomes, with the target group of samples associated with the event. Here, depending on the embodiment, the event can be defined to represent a group of samples characterized by their outcomes of the test.

In step 2340, in some embodiments, the method of selecting a second plurality of parameters includes forming a basis representation of the result of the first test using the first plurality of parameters, and selecting a subset of the parameters whose coefficients are larger than a threshold value. Depending on the embodiment, the basis representation can include sinusoid, polynomial, or exponential functions. Of course, other basis functions or combination of basis function can also be used in different embodiments.

A specific embodiment of selecting a second plurality of parameters includes forming a polynomial representation of the result of the first test using the first plurality of parameters and selecting a subset of the parameters whose coefficients are larger than a threshold value. In another embodiment, selecting a second plurality of parameters includes forming a polynomial of the first plurality of parameters based on the outcomes of testing each of the first plurality of samples and reducing the number of non-zero coefficients in the polynomial. In some embodiments, reducing the number of non-zero coefficients in the polynomial includes the following steps:

1. Form a first vector representing the outcome of testing the first plurality of samples;
2. Select a parameter from the first plurality of parameters that best represents the first vector;
3. Project the first vector onto the selected parameter;
4. Subtract the projected vector from the first vector to form a second vector; and
5. Repeat the above selecting, projecting, and subtracting steps using unselected parameters, until a magnitude of the second vector is smaller than a target reference.

In the above method, the selected parameters constitute the second plurality of parameters.

Further details of the method of FIG. 23 are similar to those described above in connections with FIG. 17. In an embodiment, selecting a second plurality of parameters includes selecting the most influential parameters from the first plurality of parameters. In another embodiment, forming a probability distribution function for each of the one or more clusters includes forming a polynomial model representing the outcomes of the samples in the cluster using the second plurality of parameters, using the polynomial model to determine a representative point for the cluster, and forming the probability distribution function for the cluster based on the representative point.

In another embodiment, the first test can include computer simulation in a specific embodiment. In another embodiment, each cluster has a center that is represented by the average values of the plurality of parameters of all samples in the cluster. In another embodiment, the cluster forming method further includes iteratively merging two of the clusters having the shortest distance until a desired number of clusters are formed. In another embodiment, the cluster forming method further comprises iteratively merging clusters until the distance between any two clusters is more than twice the distance between the center of any cluster and samples within that cluster.

In another embodiment of the method of FIG. 23, forming a probability distribution function for each of the one or more clusters includes selecting a representative point for the cluster in the parameter space and forming the probability distribution function for the cluster by shifting a mean of the first probability function to the representative point. In another embodiment, the first probability distribution function is a Gaussian function, and the probability distribution function for each cluster is a Gaussian function having a mean at the representative point for each cluster. In another embodiment, the composite probability distribution function further includes a uniform probability distribution function. In some embodiments, the composite probability distribution function can be expressed by Eq. 2, and the probability of the event is expressed by Eq. 3. As noted above, when Eq. 3 is used to compute the probability of an event, the value for $I(x^i)$ can be "1" for each sample belonging to the event and "0" for each sample outside the event.

While certain embodiments of the invention have been illustrated and described, those skilled in the art with access to the present teachings will recognize that the invention is not limited to these embodiments only. Accordingly, it is to be understood that the invention is intended to cover numerous modifications, changes, variations, substitutions, and equivalents that will be apparent to those skilled in the art.

What is claimed is:

1. In an integrated circuit yield analysis tool implemented in a computer system having one or more computer processors and a computer-readable storage medium, a method for estimating a failure probability of an integrated circuit associated with a first plurality of parameters whose values are described by a first probability distribution function, the method comprising:

selecting with one or more of the computer processors a first plurality of samples using a uniform distribution function for the first plurality of parameters;

performing a first test to determine an outcome for each of the first plurality of samples and identifying failed samples based on the determined outcomes;

selecting with one or more of the computer processors a second plurality of parameters having fewer parameters than the first plurality of parameters;

clustering the failed samples in the space of the second plurality of parameters using a computer-implemented cluster forming method that, in some cases, returns multiple clusters;

forming with one or more of the computer processors a probability distribution function for each of the one or more clusters;

forming with one or more of the computer processors a composite probability distribution function that includes a weighted combination of the first probability distribution function and the probability distribution function for each of the one or more clusters;

selecting with one or more of the computer processors a second plurality of samples using the composite probability distribution function;

performing a second test to determine an outcome for each of the second plurality of samples; and computing a failure probability with one or more of the computer processors using the outcome for each of the second plurality of samples, the first probability distribution function, and the composite probability distribution function.

2. The method of claim 1 wherein selecting a second plurality of parameters comprises:
forming a basis representation of the result of the first test using the first plurality of parameters; and
selecting a subset of the parameters whose coefficients are larger than a threshold value.

3. The method of claim 2 wherein the basis representation comprises sinusoid, polynomial, or exponential functions.

4. The method of claim 1 wherein selecting a second plurality of parameters comprises:
forming a polynomial representation of the result of the first test using the first plurality of parameters; and
selecting a subset of the parameters whose coefficients are larger than a threshold value.

5. The method of claim 1 wherein selecting a second plurality of parameters comprises:
forming a polynomial representation of the result of the first test using the first plurality of parameters; and
reducing the number of non-zero coefficients in the polynomial.

6. The method of claim 1 wherein selecting a second plurality of parameters comprises:
forming a first vector representing the outcome of testing the first plurality of samples;
selecting a parameter from the first plurality of parameters that best represents the first vector;
projecting the first vector onto the selected parameter;
subtracting the projected vector from the first vector to form a second vector; and
repeating the above selecting, projecting, and subtracting steps using unselected parameters, until a magnitude of the second vector is smaller than a target reference,
wherein the selected parameters constitute the second plurality of parameters.

7. The method of claim 1 wherein forming a probability distribution function for each of the one or more clusters comprises:
selecting a representative point for the cluster in the parameter space: and
forming the probability distribution function for the cluster by shifting a mean of the first probability function to the representative point.

8. The method of claim 1 wherein forming a probability distribution function for each of the one or more clusters comprises:
forming a polynomial model representing the outcomes of the samples in the cluster using the second plurality of parameters;
using the polynomial model to determine a representative point for the cluster;
forming the probability distribution function for the cluster based on the representative point.

9. The method of claim 8 where in forming the probability distribution function for the cluster comprises shifting the mean of the first probability distribution function to the boundary point.

10. The method of claim 1 wherein forming the probability distribution function for the cluster comprises forming a Gaussian probability distribution function using the boundary point as the mean for the Gaussian function.

11. The method of claim 1 wherein:
each cluster has a center that is represented by the average values of the plurality of parameters of all samples in the cluster; and a distance between two clusters is the distance between the centers of the two clusters.

12. The method of claim 1 wherein the cluster forming method terminates when a desired number of clusters are formed.

13. The method of claim 1 wherein forming a probability distribution function for each of the one or more clusters comprises:
selecting a representative point for the cluster in the parameter space; and
forming the probability distribution function for the cluster by shifting a mean of the first probability distribution function to the representative point.

14. The method of claim 13 wherein the first probability distribution function is a Gaussian function, and the probability distribution function for each cluster is a Gaussian function having a mean at the representative point for each cluster.

15. The method of claim 13 wherein the composite probability distribution function further comprises a uniform probability distribution function.

16. The method of claim 15 wherein the composite probability distribution function is expressed as:

$$g_\lambda(x) = \lambda_1 p(x) + \lambda_2 U(x) + \frac{(1-\lambda_1-\lambda_2)}{K}\sum_{i=1}^{K} p(x-\mu_{si})$$

where:
$g_\lambda$ is the composite probability distribution function;
p is the first probability distribution function;
U is a uniform probability distribution function;
K is the number of clusters of failing samples; and
$\lambda_1$ and $\lambda_2$ are selectable parameters.

17. The method of claim 16 wherein the failure probability is expressed by:

$$P_f = \frac{\sum_{i=1}^{N} \frac{p(x^i)}{g_\lambda(x^i)} I(x^i)}{\sum_{i=1}^{N} \frac{p(x^i)}{g_\lambda(x^i)}}$$

where:
$g_\lambda$ is the composite probability distribution function;
p is the first probability distribution function;
I is an outcome for sample $x^i$; and
N is the total number of samples.

18. A computer system for integrated circuit yield analysis, the integrated circuit being associated with a plurality of parameters which are described by a first probability distribution function, the system comprising:
a storage medium;
one or more processors coupled to said storage medium; and
computer code stored in said storage medium, wherein said computer code, when retrieved from said storage medium and executed by said one or more processor, results in:
selecting with one or more of the computer processors a first plurality of samples using a uniform distribution function for the first plurality of parameters;
performing a first test to determine an outcome for each of the first plurality of samples and identifying failed samples based on the determined outcomes;

selecting with one or more of the computer processors a second plurality of parameters having fewer parameters than the first plurality of parameters;

clustering the failed samples in the space of the second plurality of parameters using a computer-implemented cluster forming method that, in some cases, returns multiple clusters;

forming with one or more of the computer processors a probability distribution function for each of the one or more clusters;

forming with one or more of the computer processors a composite probability distribution function that includes a weighted combination of the first probability distribution function and the probability distribution function for each of the one or more clusters;

selecting with one or more of the computer processors a second plurality of samples using the composite probability distribution function;

performing a second test to determine an outcome for each of the second plurality of samples; and computing a failure probability with one or more of the computer processors using the outcome for each of the second plurality of samples, the first probability distribution function, and the composite probability distribution function.

19. The computer system of claim 18 wherein selecting a second plurality of parameters comprises:
forming a basis representation of the result of the first test using the first plurality of parameters; and
selecting a subset of the parameters whose coefficients are larger than a threshold value.

20. The computer system of claim 19 wherein the basis representation comprises sinusoid, polynomial, or exponential functions.

21. The computer system of claim 18 wherein selecting a second plurality of parameters comprises:
forming a first vector representing the outcome of testing the first plurality of samples;
selecting a parameter from the first plurality of parameters that best represents the first vector;
projecting the first vector onto the selected parameter;
subtracting the projected vector from the first vector to form a second vector; and
repeating the above selecting, projecting, and subtracting steps using unselected parameters, until a magnitude of the second vector is smaller than a target reference,
wherein the selected parameters constitute the second plurality of parameters.

22. The computer system of claim 18 wherein forming a probability distribution function for each of the one or more clusters comprises:
forming a polynomial model representing the outcomes of the samples in the cluster using the second plurality of parameters;
using the polynomial model to determine a representative point for the cluster; and
forming the probability distribution function for the cluster based on the representative point.

23. A computer readable non-transitory storage medium comprising computer code stored in said non-transitory storage medium, wherein said computer code includes instructions for a method for integrated circuit yield analysis, the integrated circuit being associated with a plurality of parameters which are described by a first probability distribution function, and wherein said computer code, when retrieved from said non-transitory storage medium and executed by a processor, results in:

selecting with one or more of the computer processors a first plurality of samples using a uniform distribution function for the first plurality of parameters;

performing a first test to determine an outcome for each of the first plurality of samples and identifying failed samples based on the determined outcomes;

selecting with one or more of the computer processors a second plurality of parameters having fewer parameters than the first plurality of parameters;

clustering the failed samples in the space of the second plurality of parameters using a computer-implemented cluster forming method that, in some cases, returns multiple clusters;

forming with one or more of the computer processors a probability distribution function for each of the one or more clusters;

forming with one or more of the computer processors a composite probability distribution function that includes a weighted combination of the first probability distribution function and the probability distribution function for each of the one or more clusters;

selecting with one or more of the computer processors a second plurality of samples using the composite probability distribution function;

performing a second test to determine an outcome for each of the second plurality of samples; and computing a failure probability with one or more of the computer processors using the outcome for each of the second plurality of samples, the first probability distribution function, and the composite probability distribution function.

24. The computer readable non-transitory storage medium of claim 23 wherein selecting a second plurality of parameters comprises:
forming a basis representation of the result of the first test using the first plurality of parameters; and
selecting a subset of the parameters whose coefficients are larger than a threshold value.

25. The computer readable non-transitory storage medium of claim 24 wherein the basis representation comprises sinusoid, polynomial, or exponentials functions.

26. The computer readable non-transitory storage medium of claim 23 wherein selecting a second plurality of parameters comprises:
forming a polynomial representation of the result of the first test using the first plurality of parameters; and
selecting a subset of the parameters whose coefficients are larger than a threshold value.

27. The computer readable non-transitory storage medium of claim 23 wherein forming a probability distribution function for each of the one or more clusters comprises:
forming a polynomial model representing the outcomes of the samples in the cluster using the second plurality of parameters;
using the polynomial model to determine a representative point for the cluster;
forming the probability distribution function for the cluster based on the representative point.

28. In an analysis tool implemented in a computer system having one or more computer processors and a computer-readable storage medium, a method for estimating a probability of an event that is associated with a first plurality of parameters, the values of the parameters being described by a first probability distribution function, the method comprising:

selecting a first plurality of samples using a uniform distribution of the values of the plurality of parameters;

performing a first test to determine an outcome for each of the selected samples;

selecting a target group of samples based on the determined outcomes, the target group of samples being associated with the event;

selecting with one or more of the computer processors a second plurality of parameters having fewer parameters than the first plurality of parameters;

clustering the target group of samples in the space of the second plurality of parameters using a computer-implemented cluster forming method that, in some cases, returns multiple clusters;

forming with one or more of the computer processors a composite probability distribution function that includes a weighted combination of the first probability distribution function and the probability distribution function for each of the one or more clusters;

selecting a second plurality of samples using the composite probability distribution function;

performing a second test to determining an outcome for each of the second plurality of event samples; and computing with one or more of the computer processors a probability of the event representing the target group of samples using the outcome of each of the second plurality of samples, the first probability distribution function, and the composite probability distribution function.

* * * * *